(12) United States Patent
Bauer et al.

(10) Patent No.: US 6,940,156 B2
(45) Date of Patent: Sep. 6, 2005

(54) ELECTRONIC MODULE WITH A SEMICONDUCTOR CHIP WHICH HAS FLEXIBLE CHIP CONTACTS, AND METHOD FOR PRODUCING THE ELECTRONIC MODULE

(75) Inventors: Michael Bauer, Regensburg (DE); Christian Birzer, Burglengenfeld (DE); Gerald Ofner, Bad Abbach (DE); Stephan Stoeckl, Schwandorf (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/673,968

(22) Filed: Sep. 29, 2003

(65) Prior Publication Data

US 2004/0075172 A1 Apr. 22, 2004

(30) Foreign Application Priority Data

Sep. 27, 2002 (DE) .......................................... 102 45 451

(51) Int. Cl.$^7$ ............................................... H01L 23/02
(52) U.S. Cl. ...................... 257/678; 257/734; 257/735; 257/736
(58) Field of Search .................................. 257/678–680, 257/734–740; 438/106, 121, 125, 116, 117

(56) References Cited

U.S. PATENT DOCUMENTS

| 5,891,366 | A | | 4/1999 | Gruenwald et al. |
| 6,133,072 | A | | 10/2000 | Fjelstad |
| 2004/0164411 | A1 | * | 8/2004 | Shin et al. .................. 257/734 |
| 2004/0262742 | A1 | * | 12/2004 | DiStefano et al. .......... 257/706 |

FOREIGN PATENT DOCUMENTS

| DE | 195 17 062 A1 | 1/1996 |
| DE | 100 49 397 A1 | 10/2001 |
| JP | 5062981 | 3/1993 |

* cited by examiner

*Primary Examiner*—Hoai Pham
*Assistant Examiner*—Nathan W. Ha
(74) *Attorney, Agent, or Firm*—Laurence A. Greenberg; Werner H. Stemer; Ralph E. Locher (57) ABSTRACT

An electronic module contains a semiconductor chip that has flexible chip contacts. The flexible chip contacts are disposed on an uppermost metallization layer and have a dimensionally stable contact plate which is connected to contact surfaces on the uppermost metallization layer via electrically conductive components in an elastomeric embedding compound.

18 Claims, 6 Drawing Sheets

ELECTRONIC MODULE WITH A SEMICONDUCTOR CHIP WHICH HAS FLEXIBLE CHIP CONTACTS, AND METHOD FOR PRODUCING THE ELECTRONIC MODULE

BACKGROUND OF THE INVENTION

Field of the Invention

The invention relates to an electronic module with a semiconductor chip that has flexible chip contacts, and to a method for producing it.

During the production of electronic modules with semiconductor chips, various materials are connected to one another by various connection technologies. The different materials have different coefficients of thermal expansion, so that the reliability of the electrical and mechanical connection of the components of an electronic module is at risk when the module is subjected to alternating temperature loads. The mechanical stresses which occur in the event of alternating temperature loads can, in particular, lead to delamination and to tearing of electrical connections between the individual components of an electronic module, which decreases the reliability and increases the scrap rate during functional tests when the module is subjected to alternating temperature loads.

SUMMARY OF THE INVENTION

It is accordingly an object of the invention to provide an electronic module with a semiconductor chip which has flexible chip contacts, and a method for producing the electronic module that overcome the above-mentioned disadvantages of the prior art devices and methods of this general type, which improves the reliability of electronic modules but also at the same time improves their resistance to alternating temperatures and reduces the scrap rate during functional testing with alternating thermal loads.

With the foregoing and other objects in view there is provided, in accordance with the invention, an electronic module. The electronic module contains a semiconductor chip, an uppermost metallization layer with rigid contact surfaces disposed on the semiconductor chip, and flexible chip contacts each containing a layer of an elastomeric embedding compound with electrically conductive components disposed on the uppermost metallization layer, and a dimensionally stable contact plate having a lower face, an upper face, and edge faces embedded in the elastomeric embedding compound. At least the lower face of the contact plate is electrically connected to the rigid contact surface on the semiconductor chip through the electrically conductive components of the elastomeric embedding compound.

According to the invention, the electronic module with the semiconductor chip has flexible chip contacts. The flexible chip contact is disposed on an uppermost metallization layer of the semiconductor chip, and a passivation layer is disposed on the uppermost metallization layer, leaving contact surfaces free. The passivation layer may be composed of a ceramic layer, which has silicon dioxide and/or silicon nitride, and a plastic layer disposed above it.

The different materials on the upper face of a semiconductor chip are connected to one another rigidly and in an interlocking manner, so that the metallization layer forms relatively rigid contact surfaces, and the plastic layer of the passivation layer is likewise relatively rigid, at least with respect to a plastic housing compound which surrounds the semiconductor chip. According to the invention, a layer of an elastomeric embedding compound with electrically conductive components is disposed on each of the rigid contact surfaces of the uppermost metallization layer. The lower face and the edge faces of a dimensionally stable plastic plate are embedded in the elastomeric embedding compound. The lower face of the dimensionally stable contact plate is electrically connected to the rigid contact surface of the semiconductor chip via the electrically conductive components of the elastomeric embedding compound.

The electronic module according to the invention has the advantage that the plastic housing compound, which expands to a relatively major extent thermally, can expand with respect to the relatively rigid semiconductor chip structure without this leading to delamination of the flexible chip contact, since the dimensionally stable contact plate of the flexible chip contact can follow the movements of the surrounding plastic housing compound, in contrast to the rigid contact surfaces of the semiconductor chip, without delamination from the semiconductor chip.

Any movement of the plastic housing compound with respect to the semiconductor chip within the electronic module is absorbed by the elastomeric embedding compound in which the dimensionally stable contact plate is embedded. The flexible chip contact in the form of a dimensionally stable contact plate, which is embedded in the elastomeric embedding compound with electrically conductive components, improves the reliability of the electronic modules during functional testing with alternating temperature loads, and at the same time reduces the scrap rate.

The stresses that occur in the region of the chip contacts as a result of alternating temperature loads are reduced by the flexible structure of the chip contacts according to the invention. The dimensionally stable contact plate results in that any desired connection technique can be used on a semiconductor chip for corresponding electronic modules, so that both flip-chip connections and bonded connections are possible. In the case of flip-chip connections, there is no need for complex introduction of an under-filling material to fill the space between the chip contacts and a printed circuit board structure disposed above them. Furthermore, any desired small flip-chip contacts can be applied to the dimensionally stable contact plate, since their size results in that these contacts do not have to absorb the thermomechanical stresses. The electronic module according to the invention thus results in a reduction in the height of the module, since there is no need for bonding heads, pillar contacts or other flip-chip contact forms that project upwards, and surface contacts for connection to corresponding contact pads on a printed circuit board are possible on the dimensionally stable contact plate.

The edge areas of the upper face of the dimensionally stable contact plate may have a cover composed of an embedding compound. The cover composed of an embedding compound has the advantage that the dimensionally stable contact plate of the flexible chip contact can be anchored not only in a force-fitting manner, but also in an interlocking manner, in the embedding compound. The electrically conductive components may be disposed in various ways in the embedding compound. For example, the embedding compound may have electrically conductive fibers that, with a high filling level of 60 to 80% by weight, ensure an electrical connection between the rigid contact surface of the semiconductor chip and the lower face of the dimensionally stable contact plate.

A felt that has electrically conductive fibers, in particular, may be filled with elastomeric material and may form the elastomeric embedding compound. In this case, the electrically conductive fibers in the felt produce the electrical connection between the rigid contact surface of the semiconductor chip and the lower face of the dimensionally stable contact plate. A further possible way to apply electrically conductive components to the contact surface is to apply very fine bonding wires by bonding a bonding clip on the rigid contact surface of the semiconductor chip, so that the bonding wire is fixed on the rigid contact surface via the bonded bonding clip. The bonding wire is capped after being pulled for a short distance out of the bonding wire guide, thus providing a freely oscillating end. The bonding wire can be embedded with its bonding clip in an elastomeric embedding compound, with the free end of the bonding wire projecting out of the embedding compound. When the dimensionally stable contact plate is introduced into the elastomeric embedding compound, the free end can then produce the electrical connection between the lower face of the contact plate and the upper face of the rigid contact surface on the semiconductor chip.

Metal whiskers have considerably smaller dimensions than bonding wires and can be chemically or electrochemically deposited as electrically conductive components onto the rigid contact surface, and can provide a flexible electrical connection in the elastomeric embedding compound between the lower face of the dimensionally stable contact plate and the upper face of the rigid contact surface.

Furthermore, nanoparticles composed of electrically conductive material, such as a silver alloy, can be provided in the embedding compound. Nanoparticles such as these have a diameter in the region of a few tens of nanometers and, during the production of an elastomeric embedding compound, form flexible agglomerates of electrically conductive nanoparticles. The agglomerates of electrically conductive nanoparticles have the advantage that they are held together just by van der Waal forces and can match themselves to the movements of the dimensionally stable contact plate on the embedding compound, thus providing a continuous electrical connection between the lower face of the dimensionally stable contact plate and the upper face of the rigid contact surface of the semiconductor chip.

In order to improve its robustness, a dimensionally stable contact plate may have a composite material composed of metal and ceramic. In this case, the ceramic forms a dimensionally stable skeleton that is filled with metal, so that the dimensionally stable contact plate can accommodate both flip-chip contacts and bonding connections. For this purpose, the contact plate may have a ceramic layer with continuous pores that are filled with metal, and may be covered on its upper face by a closed metal layer. The closed metal layer on the upper face makes it easier to fit rigid flip-chip contacts or corresponding bonding wires. In order to improve the contact making on the lower face to the electrically conductive components of the elastomeric embedding compound, the lower face of the dimensionally stable contact plate may also have a closed metal layer.

The structured layer composed of the embedding compound may be surrounded by a rigid plastic layer composed in particular of polyimide, with the polyimide layer ensuring that the embedding compound is restricted to windows in the rigid plastic layer which allow access to the rigid contact surfaces of the semiconductor chip. At the same time, the surrounding, rigid plastic layer stabilizes the position of the elastomeric embedding compound, and restricts it to the windows that are provided in the rigid plastic layer.

According to the invention, a semiconductor wafer having two or more semiconductor chip positions for two or more electronic modules is provided, with the semiconductor chip positions being disposed in rows and columns on the semiconductor wafer. The semiconductor chips that are provided in each semiconductor chip position have the characteristics and features mentioned above and, in particular, have flexible chip contacts that simplify the connection technique within an electronic module. A semiconductor wafer such as this is commercially available and is tested in advance in each of its semiconductor chip positions before the semiconductor wafer is separated to form semiconductor chips, in order to ensure that functionally nonviable semiconductor chips can be marked appropriately and be discarded once they have been separated.

A method for producing an electronic module with a semiconductor chip that has flexible chip contacts contains the now described method steps. First, a semiconductor wafer is provided, having two or more semiconductor chip positions in rows and columns. Integrated circuits are then introduced into each of the module positions, with different semiconductor structures being formed in the surface area of the semiconductor wafer.

After completion of the semiconductor structures, metallization structures are applied in each module position, with rigid contact surfaces in an uppermost metallization layer. In order to bound the rigid contact surfaces, a surface-structured rigid plastic layer is applied, leaving the contact surfaces free in windows in the plastic layer. The flexible chip contacts are then produced in these windows. To do this, a surface-structured layer composed of an elastomeric embedding compound with electrically conductive components is first introduced into the windows in the rigid plastic layer. A dimensionally stable contact plate is then fitted to this elastomeric layer in each of the windows.

The semiconductor wafer can now be separated into semiconductor chips, which can then be fitted to a circuit mount. Once the dimensionally stable contact plates have been connected to corresponding contact pads on the circuit mount via surface contacts or via external contacts, the semiconductor chip is packaged, on the circuit mount, in a package. The plastic package can be applied by a transfer molding method, and can be produced in one process step at the same time for two or more electronic modules on the circuit mount. Individual manufacture of individual circuit mounts is also feasible.

In order to produce a surface-structured elastomeric layer with electrically conductive components, bonding clips can first be bonded in the windows. The bonding clips are used to fix bonding wires on the rigid contact surfaces and form freely accessible bonding wire ends. An embedding compound can then be applied in such a way that the free ends of the bonding wires project out of the elastomeric embedding compound, so that, during the production and fitting of the contact plate, its lower face makes contact with the free ends of the bonding clips.

A further possible way to produce the surface-structured elastomeric layer with electrically conductive components is first to mix the elastomeric embedding compound with electrically conductive components, in particular with nanoparticles and/or with metal fibers. The windows in the rigid contact layer are then filled with this mixture. When the dimensionally stable contact plate is fitted, the nanoparticles and/or the metal fibers provide the electrical connection between the rigid contact surfaces of the semiconductor chip and the lower face of the dimensionally stable contact plate.

Dimensionally stable contact plates can be produced in the windows of the rigid plastic layer on the upper face of the semiconductor chip by sputtering of a composite material composed of ceramic and metal onto the elastomeric layer, with the layer that has been sputtered on that is composed of composite material subsequently being structured. In order to improve the contact with the composite material, a pure metal layer can be applied to this layer of ceramic and metal, which can be surface-structured at the same time or successively in order to form the dimensionally stable contact plates in the windows.

It is also possible to provide for a metal layer to be first applied to the elastic layer in the windows, in order to improve the contact on the lower face with the electrically conductive components of the elastomeric embedding compound, and for a porous ceramic layer with continuous pores then to be applied. Finally, a metal layer is then deposited in order to fill the continuous pores on the semiconductor wafer and, as the final step, these layers are surface-structured in order to form contact plates on the windows.

In summary, it can be stated that the connection technology according to the invention reduces thermomechanical stress caused by the flexible chip contact. This avoids typical failure mechanisms, such as fractured surfaces in the vicinity of chip contacts, because the flexible chip contact according to the invention can flex elastomerically. An elastomeric effect is thus achieved both in the plane of the contact plates and for the metal planes that are located at a deeper level.

The lateral embedding of the flexible chip contacts is achieved by producing windows in a rigid plastic layer composed of an epoxy resin and a polyimide, or of similar materials. The electrical bonding of the contact plate to the rigid contact surfaces of the semiconductor chip that are located underneath it is achieved by the various electrically conductive components in the elastomeric embedding compound, as mentioned above.

In order to ensure that the contact plate is virtually completely embedded in the elastomeric compound, and to ensure reliable mechanical anchoring, the edge areas of the contact surface are covered by the flexible, anisotropically conductive embedding compound. The anisotropic conductivity of the material is achieved essentially by the large number of electrically conductive components that are held in the elastomeric embedding compound and can be reinforced in particular by installation of bonding clips, of metal whiskers, of electrically conductive fibers and/or of nanoparticles.

Other features which are considered as characteristic for the invention are set forth in the appended claims.

Although the invention is illustrated and described herein as embodied in an electronic module with a semiconductor chip which has flexible chip contacts, and a method for producing the electronic module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
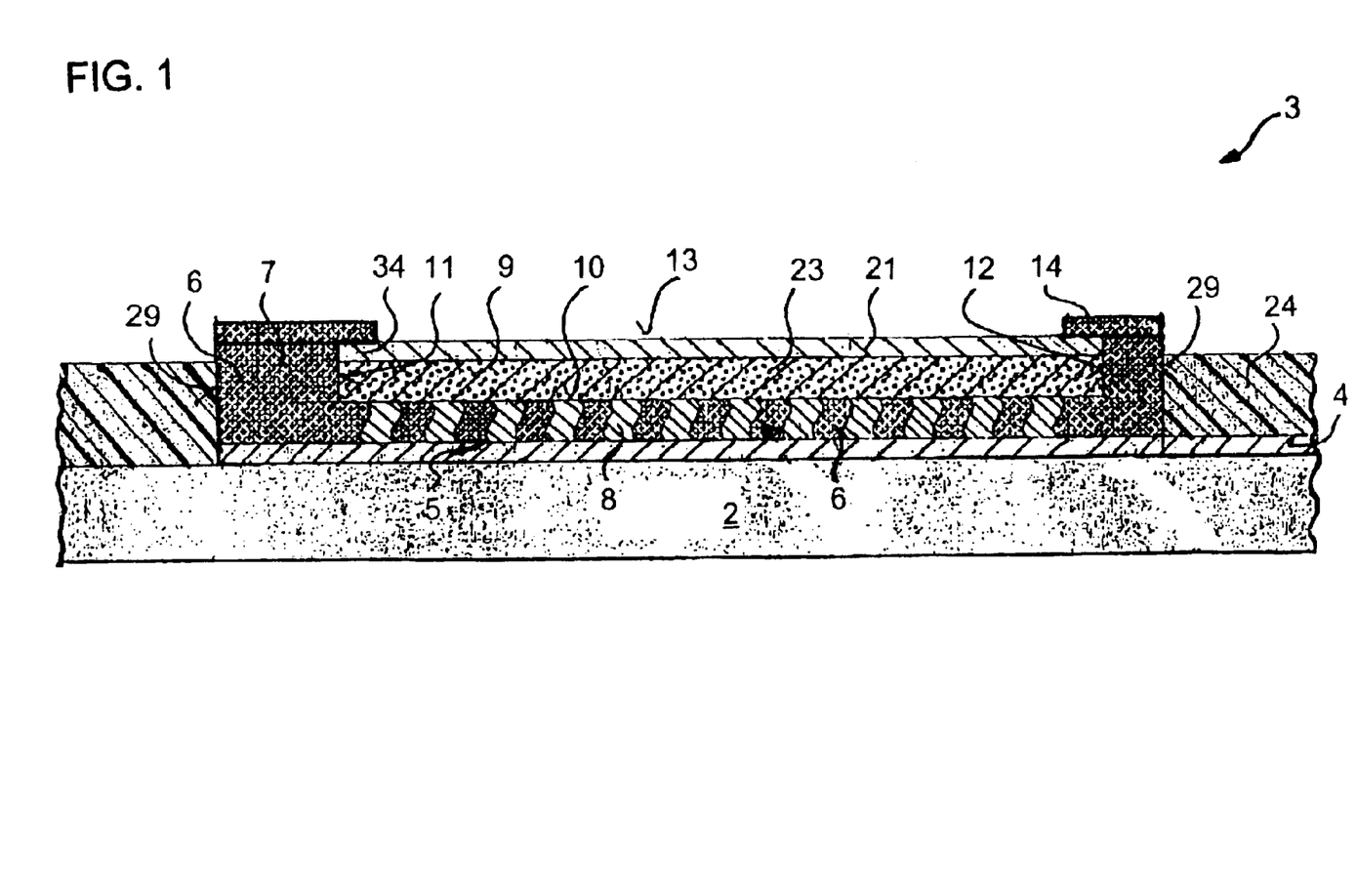
FIG. 1 is a diagrammatic, cross-sectional view through a flexible chip contact on a semiconductor chip according to a first embodiment of the invention.

Referring now to the figures of the drawing in detail and first, particularly, to FIG. 1 thereof, there is shown a schematic cross-sectional view through a flexible chip contact 3 on a semiconductor chip 2 for a first embodiment of the invention. Only an uppermost metallization layer 4 of the semiconductor chip 2 can be seen in the cross-sectional view. Since it is only between 0.5 and 2 $\mu$m thick, and because of the intensive adhesion of the metallization on the materials of the semiconductor chip 2, contact surfaces 5 of the uppermost metallization layer 4 are extremely rigid and inflexible. Although they are suitable for bonding or for soldering on external contacts, the connection point is, however, continuously subject to shear stress loads while the semiconductor chips are being introduced into a module package, owing to the low coefficient of thermal expansion of the silicon and the fact that the coefficient of thermal expansion of the surrounding plastic housing compound is more than three times greater. The rigid contact surfaces on the silicon semiconductor chip are thus a cause of failure for electronic modules when they are subjected to alternating temperature loads.

The rigid contact surface 5 is surrounded by a rigid plastic layer 24 that has windows 29 that expose the contact surfaces 5. An elastomeric embedding compound 7 of an elastomeric layer 6 is disposed in the windows 29 in the rigid plastic layer 24 and has electrically conductive components 8. A lower face 10 and edge faces 11 and 12 of a dimensionally stable contact plate 9 are embedded in the elastomeric compound 7. The lower face 10 of the contact plate 9 and the rigid contact surface 5 are electrically connected to one another via the electrically conductive components 8 in the elastomeric embedding compound 7. In practice, the dimensionally stable contact plate 9 floats on the elastomeric embedding compound 7 and is connected to the rigid contact surface 5 via the electrically conductive components 8.

In order to anchor the dimensionally stable contact plate 9 in the embedding compound 7, edge areas 34 of the dimensionally stable contact plate 9 are covered by a layer of elastomeric embedding compound 7. A cover 14 such as this for the contact plate 9 in its edge area 34 of the upper face 13 can be applied after the lower face 10 and the edge faces 11 and 12 of the contact plate 9 have been embedded. The dimensionally stable contact plate 9 is admittedly intrinsically likewise rigid, but it can be moved laterally on the flexible embedding compound 7 and can thus flex in response to any shear stresses, or can dissipate such shear stresses, without interrupting the electrical contact via the electrically conductive components 8 to the rigid contact surface 5.

In order to ensure the dimensional stability of the contact plate 9, it has two or more layers, in the first embodiment of the invention. The robustness is achieved by a porous ceramic layer 23, which has open pores and is covered by a metal layer 21, which at the same time fills the pores in the ceramic layer 23 with metal. The filling of the ceramic layer 23 with electrically conductive metal can also be achieved by the ceramic layer 23 being formed from a composite material composed of ceramic and metal.

The surface size of a contact plate such as this is about 50×50 $\mu m^2$. The contact plate 9 is surrounded by the ring of elastomeric embedding compound 7 with a width of between 1 and 5 $\mu m$. The elastomeric layer 7 underneath the dimensionally stable contact plate 9 has a thickness of between 2 and 25 $\mu m$. The dimensionally stable contact plate 9 has a thickness of between 5 and 25 $\mu m$. The rigid plastic layer 24 has a corresponding thickness, in order to accommodate a structure such as this with a flexible chip contact 3 in the window 29. The thickness of the rigid plastic layer 24 is accordingly between 7 and 50 $\mu m$.

The electrically conductive components 8 in the first embodiment of the invention are metal whiskers, which are chemically or electrochemically deposited before the elastomeric embedding compound 7 is applied to the rigid contact surface 5. The growth of whiskers is subject to corresponding boundary conditions to those for the deposition process. In this case, the whiskers 8 are firmly connected to the rigid contact surface 5 and, since they are extremely flexible, their free ends may project out of the elastomeric layer 6 that is to be introduced, so that they can be electrically connected to the lower face of the dimensionally stable contact plate 9. The diameter of the whiskers is in the range between 0.5 and 3 $\mu m$.

The first embodiment of the invention thus provides a flexible, flat chip contact 3 to which flat conductor structures on a printed circuit board can be directly connected, in which case the printed circuit board may have a considerably higher coefficient of thermal expansion than the semiconductor chip 2 without there being any possible risk of delamination of the rigid contact surface 5 or of interruption of the electrical connection for the structure on the printed circuit board, even when subjected to extreme temperature loads.

Figure 2:
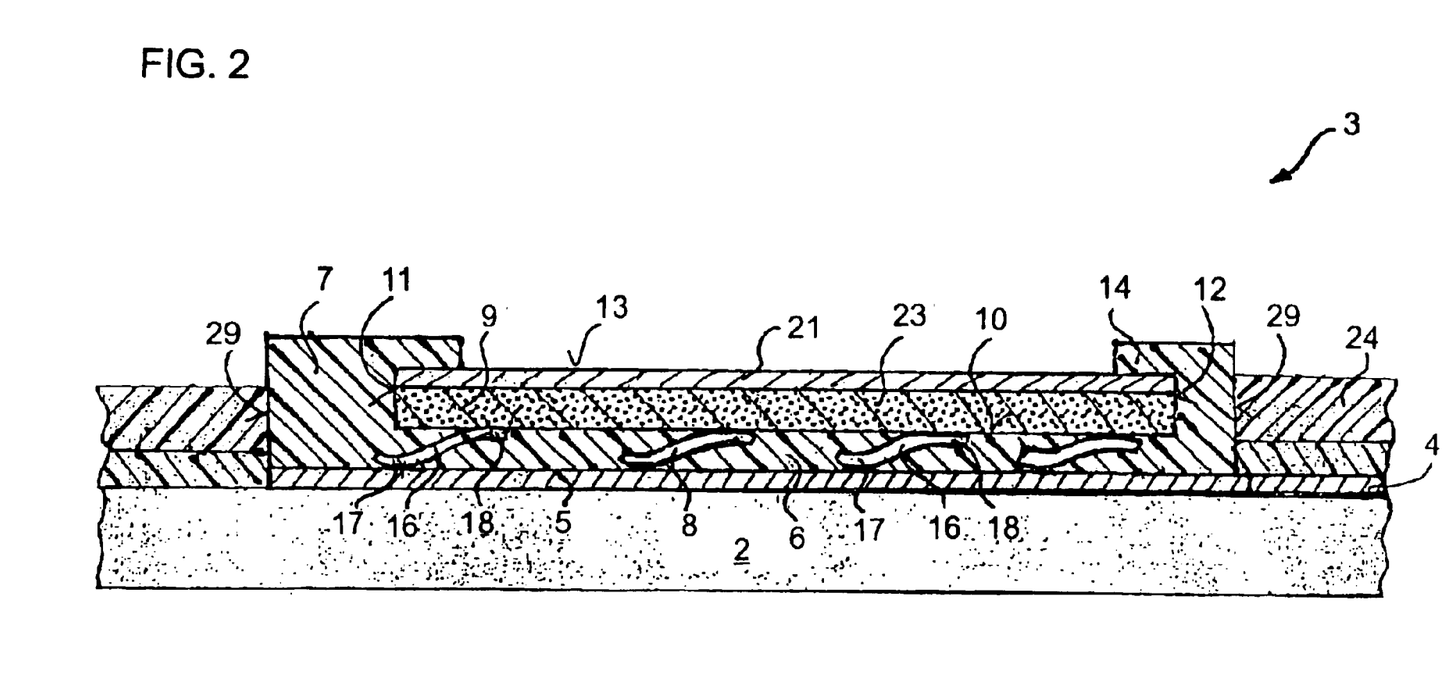
FIG. 2 is a cross-sectional view through the flexible chip contact on the semiconductor chip according to a second embodiment of the invention.

FIG. 2 shows a schematic cross section through the flexible chip contact 3 on the semiconductor chip 2 for a second embodiment of the invention. Components with the same functions as those in FIG. 1 are identified by the same reference symbols, and will not be explained once again.

The difference between the flexible chip contact 3 for the second embodiment and the flexible chip contact 3 for the first embodiment is the formation of the electrically conductive components 8 in the elastomeric embedding compound 7. In the second embodiment of the invention, bonding wires 16 have been bonded by bonding clips 17 on the rigid contact surface 5 in the window 29, and the bonding wires 16 have been pulled away from the bonding clips 17, at free ends 18. The free ends 18 may initially project out of the elastomeric layer 6 after its introduction and structuring, so that they form a reliable electrical contact with the lower face 10 of the dimensionally stable contact plate 9. For the introduction of the bonding clips 17 with the bonding wires 16, the thickness of the elastomeric layer 6 underneath the contact plate 9 is configured to be considerably thicker than in the first embodiment of the invention, and extends up to a maximum of 25 $\mu m$. Gold wires with a minimal diameter of between 8 and 18 $\mu m$ are used as the bonding wires 16.

Figure 3:
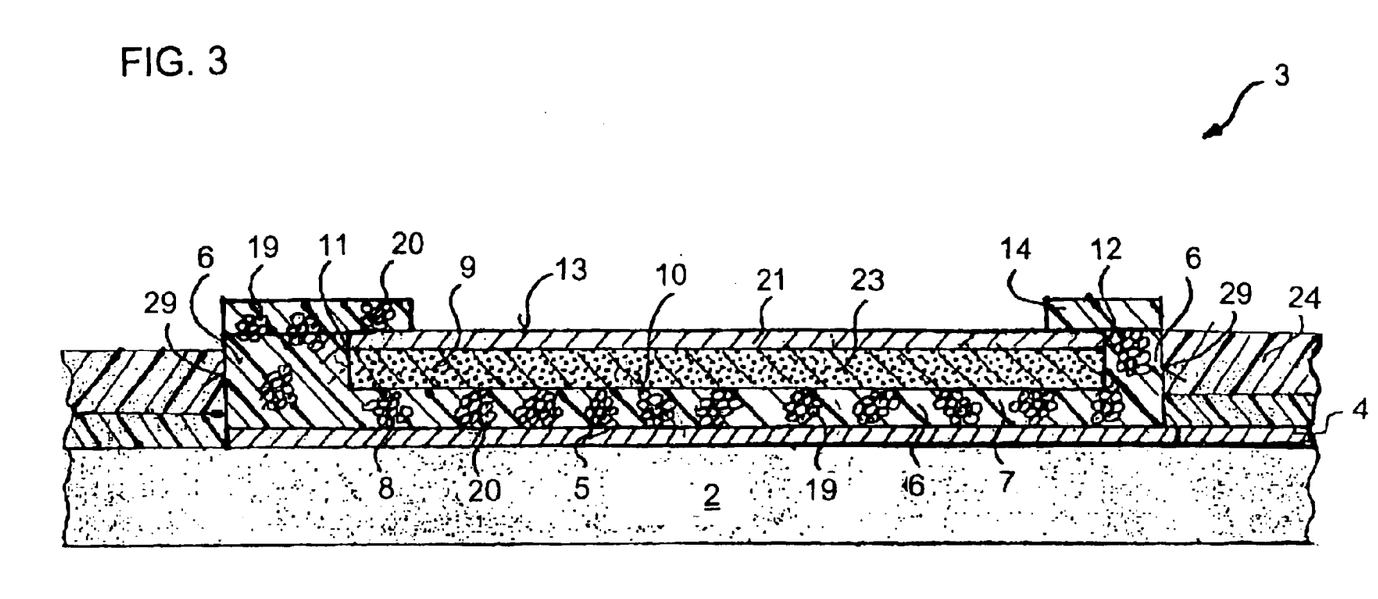
FIG. 3 is a cross-sectional view through the flexible chip contact on the semiconductor chip according to a third embodiment of the invention.

FIG. 3 shows a schematic cross section through the flexible chip contact 3 on the semiconductor chip 2 for a third embodiment of the invention. Components with the same functions as those in the previous embodiments are identified by the same reference symbols, and will not be explained once again.

In the third embodiment of the invention, it is possible to achieve extremely thin layer thicknesses for the elastomeric layer 6 between the rigid contact surface 5 and the lower face 10 of the dimensionally stable contact plate 9. Nanoparticles 19 composed of metals are mixed as electrically conductive components into the elastomeric embedding compound 7 and these are drawn together, even before the elastomeric embedding compound has solidified, to form flexible agglomerates 20, on the basis of their mutual high van der Waal attraction forces.

The very loose van der Waal bonds of the nanoparticles 19 in the agglomerates 20 allow the agglomerates 20 to match themselves to the various movements of the dimensionally stable contact plate 9 with respect to the rigid contact surface 5, and to ensure an electrical connection between the lower face 10 of the contact plate 9 and the rigid contact surface 5. The elastomeric layer 6 with the nanoparticles 19 such as these can thus be used for a flexible chip contact, particularly in the lower thickness ranges from 2 to 8 $\mu m$.

Figure 4:
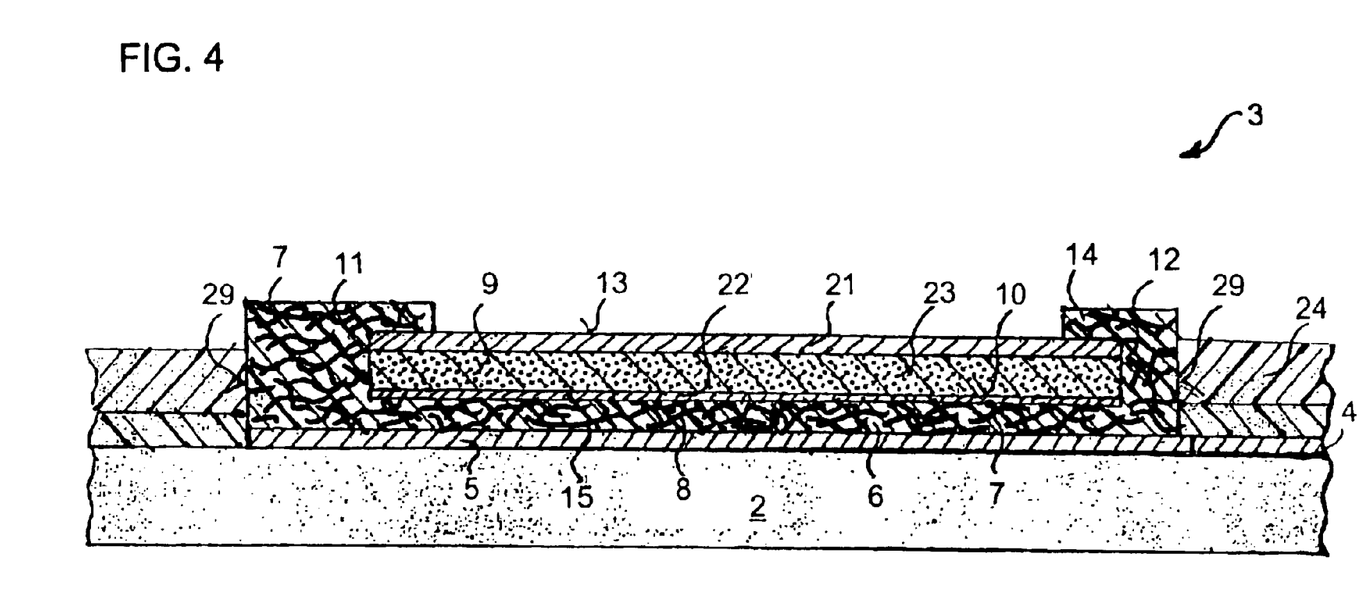
FIG. 4 is a cross-sectional view through the flexible chip contact on the semiconductor chip according to a fourth embodiment of the invention.

FIG. 4 shows a schematic cross section through the flexible chip contact 3 on the semiconductor chip 2 for a fourth embodiment of the invention. Components with the same functions as in the previous embodiments are identified by the same reference symbols, and will not be explained once again.

The fourth embodiment of the invention differs from the previous embodiments in that metal fibers in the form of a metal felt are incorporated in the embedding compound 7 as the electrical components 8. The metal fibers have diameters of between 1 $\mu m$ and 10 $\mu m$ and are formed into a felt with one another during the mixing of the elastomeric embedding compound with these short fibers, such that a reliable electrical contact is ensured between the rigid contact surface 5 and the lower face 10 of the dimensionally stable contact plate 9. Furthermore, the lower face 10 of the dimensionally stable contact plate 9 is also covered with a metal layer 22, which ensures that a reliable contact is made with the electrically conductive components in the form of electrical fibers 15 that are formed into a felt with one another.

An embodiment of the invention such as this covers the medium thickness range for the elastomeric layer 6 between the rigid contact surface 5 and the metallized lower face 10 of the contact plate 9. The medium thickness range is between 8 and 15 $\mu m$.

Figure 5:
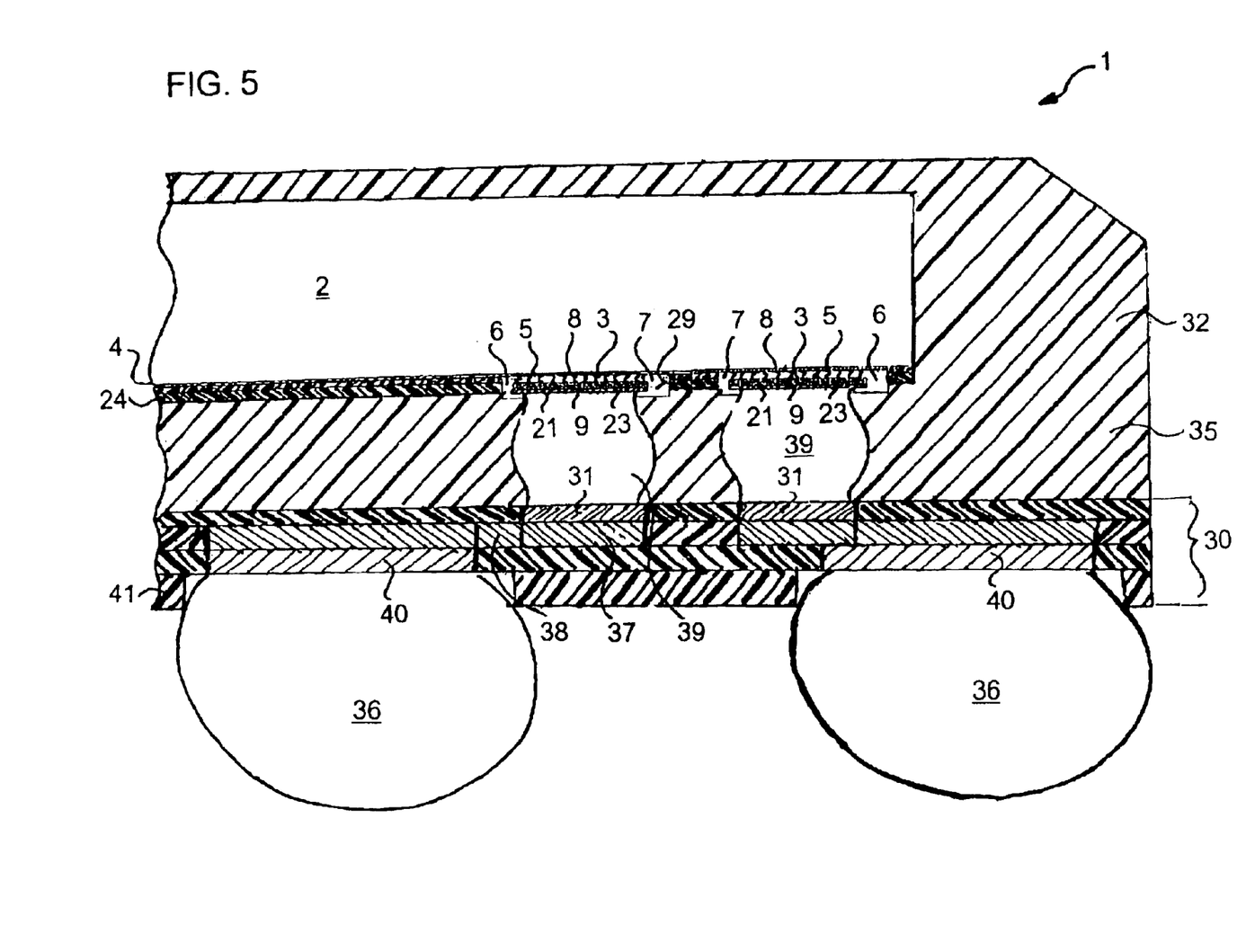
FIG. 5 is a sectional view through a semiconductor module with the flexible chip contact according to a first embodiment of the invention.

FIG. 5 shows a schematic cross section through a semiconductor module 1 with the flexible chip contact 3 for the first embodiment of the invention. Components with the same functions as in the previous embodiments are identified by the same reference symbols, and will not be explained once again.

The semiconductor chip 2 is embedded with the flexible chip contacts 3 in a plastic housing compound 35 in order to form the package 32. The plastic housing compound 35 is disposed on a circuit mount 30, which has external contacts 36. The circuit mount 30 has two or more isolation layers, which partially enclose through contacts 37 and partially enclose interposer lines 38. Contact pads 31 are disposed on the layer of the circuit mount 30 which faces the semiconductor chip 2 and, in this embodiment of the invention, are connected to the flexible chip contacts 3 of the semiconductor chip 2 via microscopically small solder balls 39. In one example, which is not illustrated here, flat solder layers may also be disposed on the contact pads 31 instead of solder balls, in order to minimize the height of the module.

The diameter of these microscopically small solder balls is in the region of 50 μm in this exemplary embodiment, while the diameter of the external contacts 36 is several hundred micrometers. While the flexible chip contacts 3 of the semiconductor chip 2 are disposed in the windows 29 in the rigid plastic layer 24 composed of polyimide, metallic external contact surfaces on which the external contacts 36 are disposed are bounded by a solder resist varnish layer 41 on the circuit mount 30. It is also possible to use conductive adhesives instead of solder balls 39 or instead of solder layers that are not shown here, in order to ensure an electrical connection between the mount board 30 with its contact pads 31 and the semiconductor chip 2 with its flexible chip contacts 3. In this case that is not illustrated, as well, the module height of the electronic module 1 can be considerably reduced.

Figure 6:
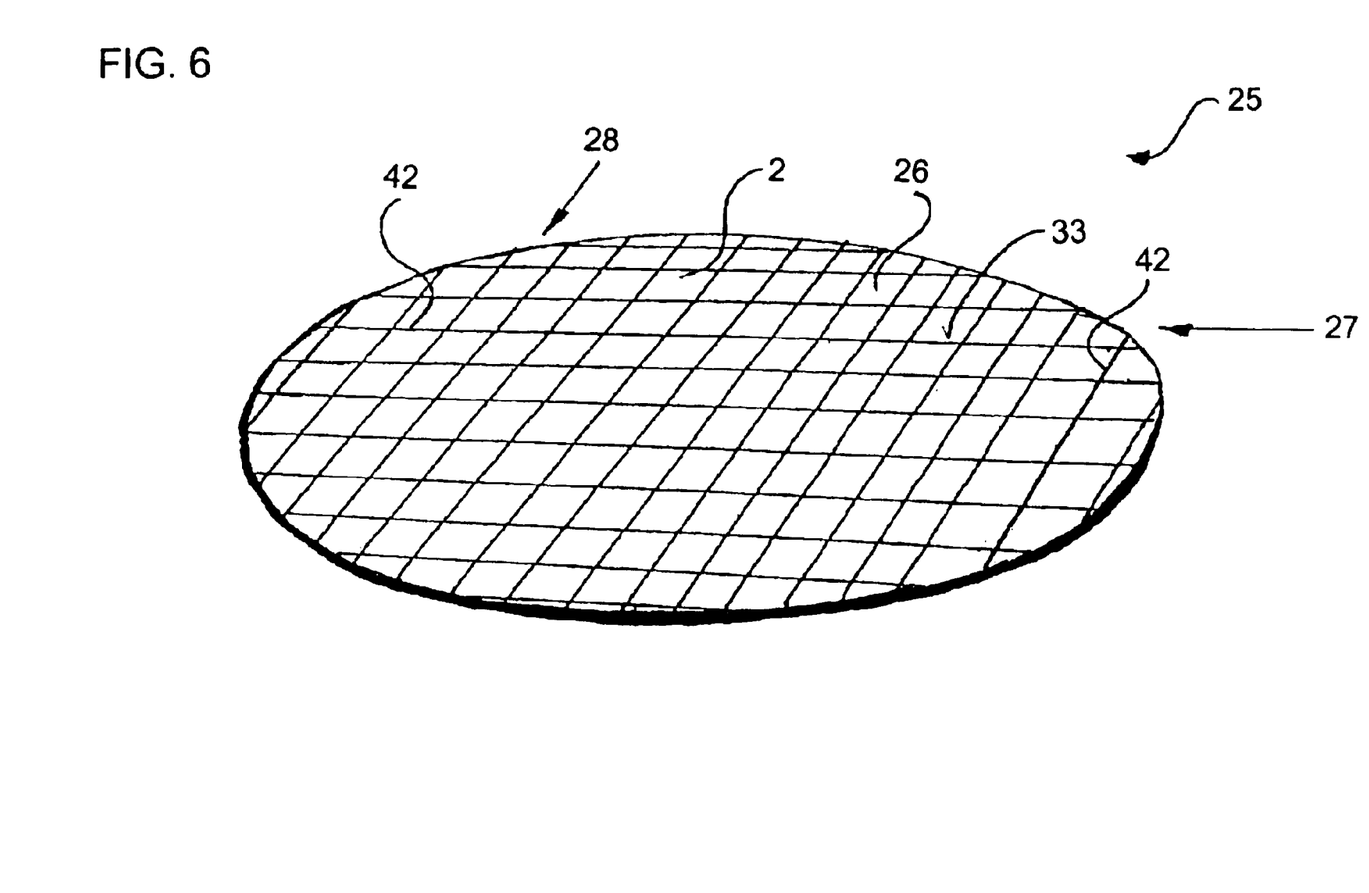
FIG. 6 is a perspective view of a semiconductor wafer with semiconductor chip positions.

FIG. 6 shows a schematic perspective view of a semiconductor wafer 25 with semiconductor chip positions 26. Components with the same functions as in the previous embodiments are identified by the same reference symbols, and will not be explained once again.

The semiconductor chip positions 26 are disposed in columns 28 and rows 27 on the semiconductor wafer 25 and each have a semiconductor chip 2 that is equipped with the flexible chip contacts. Once integrated circuit structures have been introduced into each of the module positions by appropriate mask technology, diffusion technology or ion implantation technology, two or more metallization structures are incorporated in an uppermost metallization layer in each of the module positions 26, and with rigid contact surfaces, on the semiconductor chip. Finally, a surface-structured, rigid plastic layer is applied over the entire polyimide wafer on the uppermost metallization layer, and windows that expose the rigid contact surfaces are then incorporated in the rigid polyimide plastic, by a photolithography step.

Electrically conductive components, such as metal whiskers or bonding wires, can be applied to the rigid contact surfaces and can then be partially embedded in an embedding compound, or an embedding compound with electrically conductive components can first be mixed, with a layer of the embedding compound then being applied to the wafer, with the layer then being surface-structured, and subsequently remaining only in the windows in the rigid plastic layer. A dimensionally stable contact plate is then produced on the elastomeric layer in each of the windows, thus in practice simultaneously producing a flexible chip contact in each contact surface position of a semiconductor chip for an entire semiconductor wafer, and thus for two or more semiconductor chip positions.

A semiconductor wafer 25 such as this, as is shown in FIG. 6, is separated, after completion of production, along the separating lines 42 to form individual semiconductor chips 2, which are then positioned on a circuit mount, with their flexible chip contacts being electrically connected to corresponding contact pads on the circuit mount.

We claim:

1. An electronic module, comprising:
a semiconductor chip;
an uppermost metallization layer with rigid contact surfaces disposed on said semiconductor chip; and
flexible chip contacts each containing a layer of an elastomeric embedding compound with electrically conductive components disposed on said uppermost metallization layer, and a dimensionally stable contact plate having a lower face, an upper face, and edge faces embedded in said elastomeric embedding compound, at least said lower face of said contact plate electrically connected to said rigid contact surface on said semiconductor chip through said electrically conductive components of said elastomeric embedding compound.

2. The electronic module according to claim 1, wherein said flexible chip contacts each have a cover composed of said elastomeric embedding compound covering said edge faces and said upper face of said contact plate.

3. The electronic module according to claim 2, wherein said dimensionally stable contact plate contains a composite material composed of metal and ceramic.

4. The electronic module according to claim 1, wherein said elastomeric embedding compound has electrically conductive fibers.

5. The electronic module according to claim 1, wherein said elastomeric embedding compound contains a felt composed of electrically conductive fibers.

6. The electronic module according to claim 1, wherein said elastomeric embedding compound contains bonding wires with bonding clips mounted on said rigid contact surface by said bonding clips and said bonding wires having free ends making contact with said lower face of said dimensionally stable contact plate.

7. The electronic module according to claim 1, wherein said elastomeric embedding compound contains electrically conductive nanoparticles.

8. The electronic module according to claim 7, wherein said elastomeric embedding compound has flexible agglomerates formed from said electrically conductive nanoparticles.

9. The electronic module according to claim 1, wherein said dimensionally stable contact plate has a ceramic layer with metal-filled continuous pores, and a closed metal layer covering at least one of said upper face and said lower face of said dimensionally stable contact plate.

10. The electronic module according to claim 1, further comprising a rigid plastic layer surrounding said layer composed of said elastomeric embedding compound.

11. The electronic module according to claim 10, wherein said rigid plastic layer is formed of a polyimide.

12. A semiconductor wafer, comprising:
a semiconductor wafer having at least two semiconductor chip positions disposed in rows and columns on said semiconductor wafer;
electronic modules each disposed at one of said semiconductor chip positions, said electronic modules each containing:
a semiconductor chip;
an uppermost metallization layer with rigid contact surfaces disposed on said semiconductor chip; and
flexible chip contacts each containing a layer of an elastomeric embedding compound with electrically conductive components disposed on said uppermost metallization layer, and a dimensionally stable contact plate having a lower face and an upper face with edge faces embedded in said elastomeric embedding compound, at least said lower face of said contact plate electrically connected to said rigid contact surface on said semiconductor chip through said electrically conductive components of said elastomeric embedding compound, each of said semiconductor chip positions having said flexible chip contacts, and said semiconductor wafer can be separated to form separate semiconductor chips.

13. A method for producing an electronic module containing a semiconductor chip having flexible chip contacts, which comprises the steps of:

providing a semiconductor wafer having at least two module chip positions disposed in rows and columns;

introducing an integrated circuit into each of the module chip positions;

applying a metallization structure in each of the module chip positions, the metallization structure having an uppermost metallization layer with a rigid contact surface;

applying a surface-structured rigid plastic layer, the surface-structured rigid plastic layer having windows formed therein leaving free the contact surface; producing a surface-structured layer composed of an elastomeric embedding compound with electrically conductive components, the surface-structured layer filling the windows in the surface-structured rigid plastic layer;

applying one dimensionally stable contact plates onto the surface-structured layer with one of the dimensionally stable contact plates disposed in each of the windows;

separating the semiconductor wafer into semiconductor chips;

fitting the semiconductor chips onto circuit mounts;

connecting the dimensionally stable contact plates to contact pads on the circuit mounts; and packing the semiconductor chips on the circuit mounts in a package.

14. The method according claim 13, which further comprises producing the surface-structured layer with electrically conductive components by bonding bonding clips in the windows, and embedding the bonding clips in the elastomeric embedding compound of the surface-structured layer in the windows, with free ends of the bonding clips projecting out of the elastomeric embedding compound.

15. The method according to claim 13, which further comprises producing the surface-structured layer with electrically conductive components by mixing the elastomeric embedding compound with the electrically conductive components and filling the windows with the mixture of the elastomeric embedding compound with the electrically conductive components.

16. The method according to claim 15, which further comprises using at least one of nanoparticles and metal fibers as the electrically conductive components.

17. The method of claim 13, which further comprises sputtering a composite material composed of ceramic and metal onto the surface-structured layer; and structuring the composite material to form the dimensionally stable contact plates in each of the windows.

18. The method of according to claim 13, which further comprises:

depositing a layer system by initially depositing a metal layer, followed by a porous ceramic layer with continuous pores and, finally, a metal layer in each of the windows and filling the continuous pores; and structuring the layer system for forming the dimensionally stable contact plates in each of the windows.

* * * * *